US006653681B2

(12) United States Patent
Appel

(10) Patent No.: US 6,653,681 B2
(45) Date of Patent: Nov. 25, 2003

(54) ADDITIONAL CAPACITANCE FOR MIM CAPACITORS WITH NO ADDITIONAL PROCESSING

(75) Inventor: Andrew T. Appel, Bloomington, IN (US)

(73) Assignee: Texas Instruments Incorporated, Dallas, TX (US)

( * ) Notice: Subject to any disclaimer, the term of this patent is extended or adjusted under 35 U.S.C. 154(b) by 69 days.

(21) Appl. No.: 10/008,144

(22) Filed: Nov. 8, 2001

(65) Prior Publication Data

US 2002/0113292 A1 Aug. 22, 2002

Related U.S. Application Data

(60) Provisional application No. 60/259,281, filed on Dec. 30, 2000.

(51) Int. Cl.[7] .................. H01L 27/108; H01L 29/00
(52) U.S. Cl. .................. 257/307; 257/308; 257/309; 257/310; 257/534
(58) Field of Search .................. 257/532, 207, 257/758, 307, 308, 309, 306, 324, 341, 310, 534; 361/301.4, 306.1, 305

(56) References Cited

U.S. PATENT DOCUMENTS 3,904,996 A * 9/1975 Rosenfeld .................. 333/196
2001/0018098 A1 * 8/2001 Sun et al. .................. 427/485

* cited by examiner

*Primary Examiner*—Minh Loan Tran
*Assistant Examiner*—Tan Tran
(74) *Attorney, Agent, or Firm*—Rose Alyssa Keagy; W. James Brady, III; Frederick J. Telecky, Jr.

(57) ABSTRACT

Capacitance for MIM capacitors is increased by connecting another interdigitated pattern at the poly level in parallel with overlying patterns at the metal levels. The poly layout is optimized to maximize intralevel capacitive coupling through sidewall nitride.

16 Claims, 3 Drawing Sheets

ADDITIONAL CAPACITANCE FOR MIM CAPACITORS WITH NO ADDITIONAL PROCESSING

CROSS-REFERENCE TO RELATED APPLICATIONS

This application claims priority under 35 USC §119(e)(1) of provisional application No. 60/259,281 filed Dec. 13, 2000.

STATEMENT REGARDING FEDERALY SPONSORED RESEARCH OR DEVELOPMENT

Not Applicable

INCORPORATION-BY-REFERENCE OF MATERIAL SUBMITTED ON A COMPACT DISC

Not Applicable

REFERENCE TO A "MICROFICHE APPENDIX"

Not Applicable

BACKGROUND OF THE INVENTION

1. Field of the Invention

The present invention relates to integrated circuit structures and fabrication methods, and particularly to capacitor structures.

2. Description of Related Art

MIM (metal-insulator-metal) capacitors are used in integrated circuits, particularly in analog applications. MIM capacitors typically comprise multiple levels of interdigitated metal fingers that are stacked and biased to maximize coupling. Insulating dielectric material fills the space between and around these metallized lines.

BRIEF SUMMARY OF THE INVENTION

The present application discloses an improvement to capacitor structures on integrated circuits. In the preferred embodiment, a polysilicon pattern is deposited and covered by nitride sidewalls. This is done by a blanket nitride deposition which is isotropically etched back to just cover the edges of the poly. The nitride, having a high dielectric constant, enhances the corner and lateral capacitance of at least the first level of the MIM capacitor structure. The poly pattern is optimized so that a maximum amount of area is covered by the nitride sidewalls (i.e., the percent of intralevel gap filled with nitride is maximized), adding further to the capacitance of the MIM structure.

Advantages of the disclosed methods and structures, in various embodiments, can include one or more of the following:

increases capacitance with no added process steps;

uses chip space that is typically unused.

BRIEF DESCRIPTION OF THE SEVERAL VIEWS OF THE DRAWINGS

The disclosed inventions will be described with reference to the accompanying drawings, which show important sample embodiments of the invention and which are incorporated in the specification hereof by reference, wherein.

DETAILED DESCRIPTION OF THE INVENTION

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Figure 1:
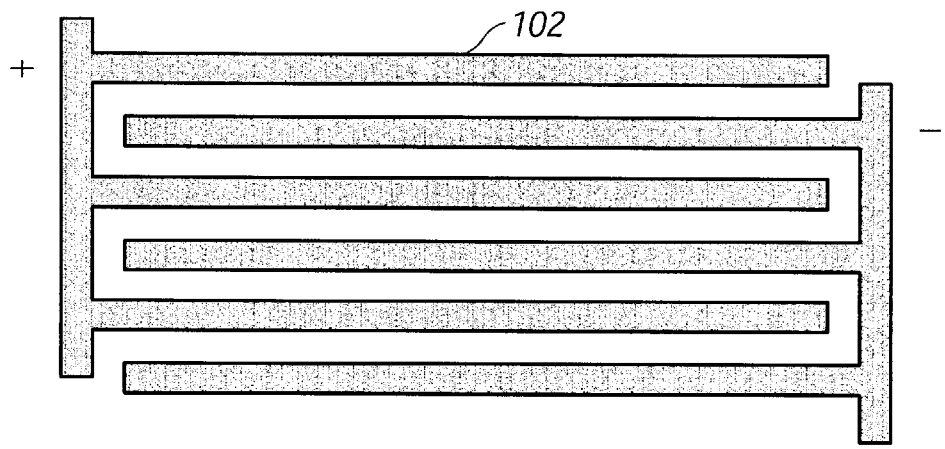
FIG. 1 shows a top view of a MIM capacitor structure.

FIG. 1 shows a top view of a MIM capacitor structure. The MIM capacitors, used in analog applications, comprise several levels of metallized lines 102. Lines within the same level are interdigitated, and the lines of different levels are typically vertically stacked to maximize capacitive coupling. The metal lines are of alternating voltages, possibly both intralevel and interlevel, as shown in the figure with "+" and "−" signs indicating relative bias.

Figure 2:
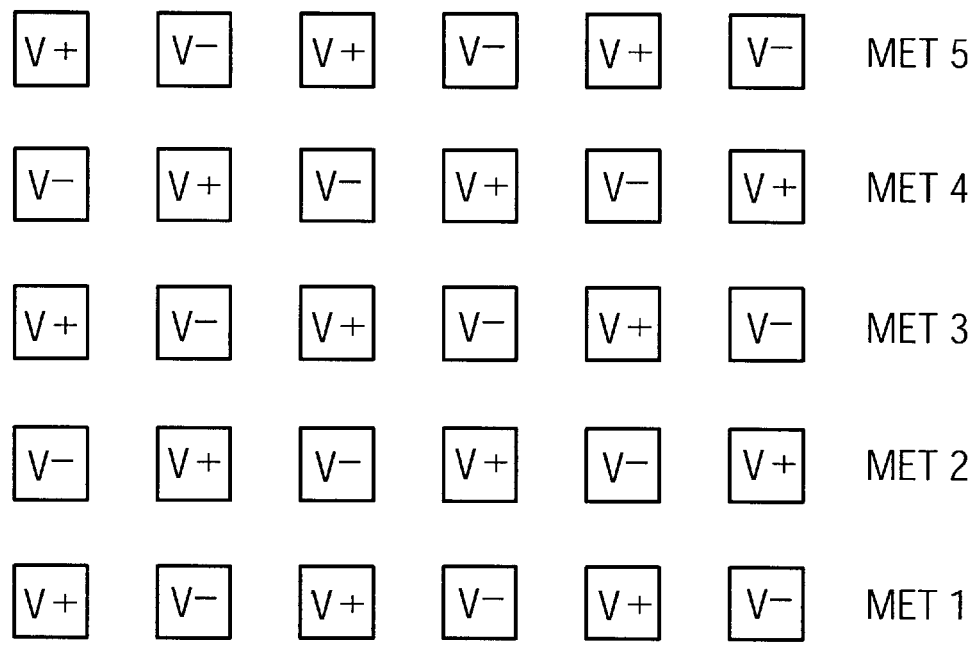
FIG. 2 shows a side view of a MIM capacitor structure according to the preferred embodiment.
Figure 2:
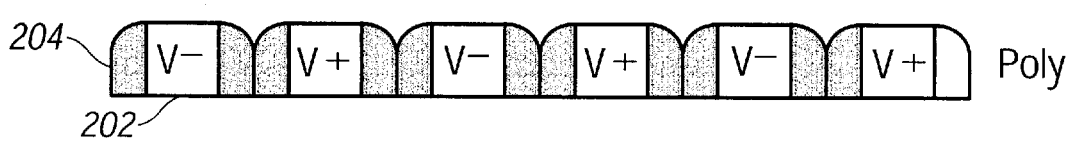

FIG. 2 shows a side view of the multi-level MIM capacitor structure, seen end on along the line 2—2 from FIG. 1. In this example, there are five metal levels, labeled MET1–MET5. The relative bias of the different metal lines is indicated. In the preferred embodiment, beneath the MET1 level there is formed a layer comprising polysilicon lines 202 covered with silicon nitride 204. In the preferred embodiment, the poly lines are covered with a blanket nitride deposition. This is etched back so that only the sidewalls of the nitride remain. The poly is then topped with a silicide, and the structure is then covered with a thin blanket nitride in a plasma enhanced chemical vapor deposition process. Since no contact can be made to the poly layer beneath the MIM capacitor structure, this area typically goes unused.

Though the metal levels are thicker than the poly level, the continual move to lower dielectric constant dielectrics (to increase overall circuit speed) decreases the total capacitance of the MIM structure. The polysilicon level with the nitride sidewalls and caps to the poly lines adds to the capacitance because of the high effective dielectric constant of the added nitride (k=7.5). (Note that the dielectric constant ("k") is a characteristic quantity of a given dielectric substance and it's sometimes called the "permittivity".)

By optimizing the poly layout, the amount of nitride is increased, which increases enhancement of capacitance, especially lateral and corner components. Since the thickness of the nitride caps is relatively small, and since the poly/nitride lines are covered by a layer of phosphorous doped glass (k=4.4), the interlevel capacitance (i.e., the plane-to-plane capacitance) is not enhanced as much as the intralevel capacitance (i.e. line-to-line capacitance).

Figure 3:
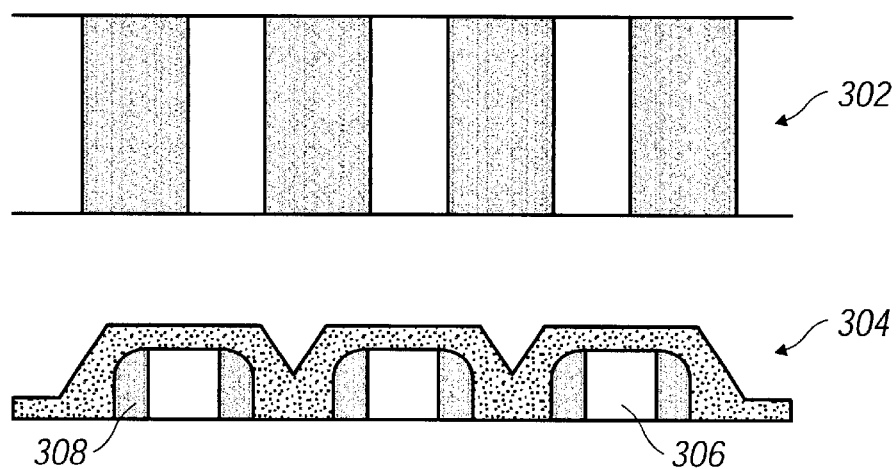
FIG. 3 shows a detail of two levels of the preferred structure.

FIG. 3 shows a closer view of the poly level and MET1. The metal level 302 is thicker than the poly level 304. The polysilicon lines 306 are covered with a layer of nitride that forms sidewalls 308 to the poly lines and also forms caps on the tops of the poly lines. This structure is covered by a layer of phosphorous doped glass 310. The nitride is formed with a blanket deposition and blanket etchback and is the same for all poly geometries (i.e., it is not generic to a specific capacitor). The sidewall nitride, after etchback, has thickness of about 80 nm+/−12 nm. The cap is about 30 nm thick. Between the MET1 level and the poly level is the PMD, or pre-metal dielectric.

To maximize the amount of nitride (and thus the average dielectric constant of the area), the polysilicon lines are placed at their minimum thickness and spacing. In the preferred embodiment, the poly lines are about 0.15 microns wide with about 0.2 micron spacings. The metal level lines are 0.175 microns wide, with 0.175 micron spacings. Though these relative feature sizes are compatible, they do not exactly match, so some optimization scheme must be employed to maximize all capacitances. For example, in one embodiment the two levels (MET1 and the poly level) are aligned on center points of the lines to maximize capacitance.

The relative capacitances of the poly level and MET1 are found using the equation for parallel plate capacitance, $$C = \frac{K_o \epsilon_o A}{x_o}$$

where $K_o$ is the effective dielectric constant, epsilon nought is the permittivity of free space, A is the area of the plates, and $x_o$ is the distance between the plates. If the effective dielectric constant of the poly level is 5.6, with poly thickness of 0.16 microns and spacing of 0.2 microns between poly lines; and if the intralevel dielectric for MET1 has an effective dielectric constant of 4.0 with a thickness of 0.31 microns, spaced at 0.175 microns, then the ratio of the capacitance of the poly level and the MET1 level is about 64%. Thus, adding the poly level to the stack will increase the capacitance by at least 64% of the MET1 capacitance. This can be increased further by maximizing the space within the poly level that is filled with high dielectric constant nitride. The resulting increase in capacitance is mostly a line-to-line capacitance increase for the MET1 level only.

Figure 4:
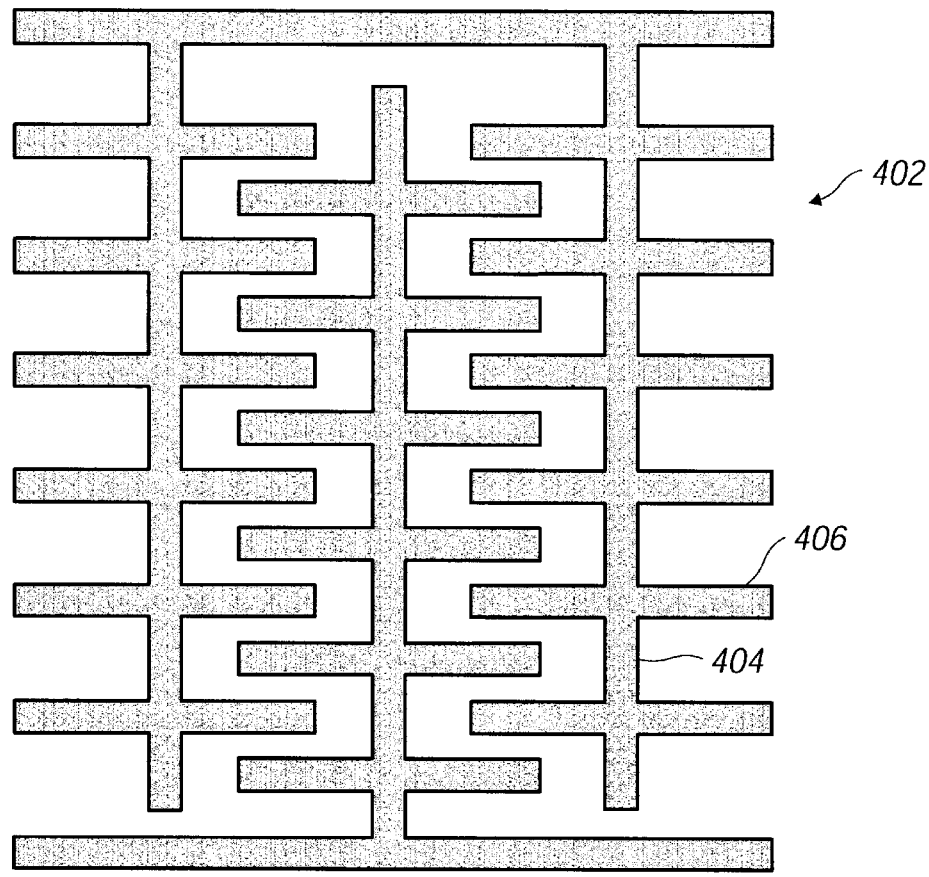
FIG. 4 shows a top view of a polysilicon pattern according to the preferred embodiment.

In order to maximize the effects of the poly/nitride layer on the capacitance of the MIM structure, the poly layout is preferably optimized to maximize the amount of nitride. FIG. 4 shows a top view of the preferred embodiment for the poly layout. This "Christmas tree" pattern 402 comprises major interdigitated lines of poly 404 with minor branches of poly 406 extending from them and further interdigitated with one another. The nitride is grown on and around these lines.

Figure 5:
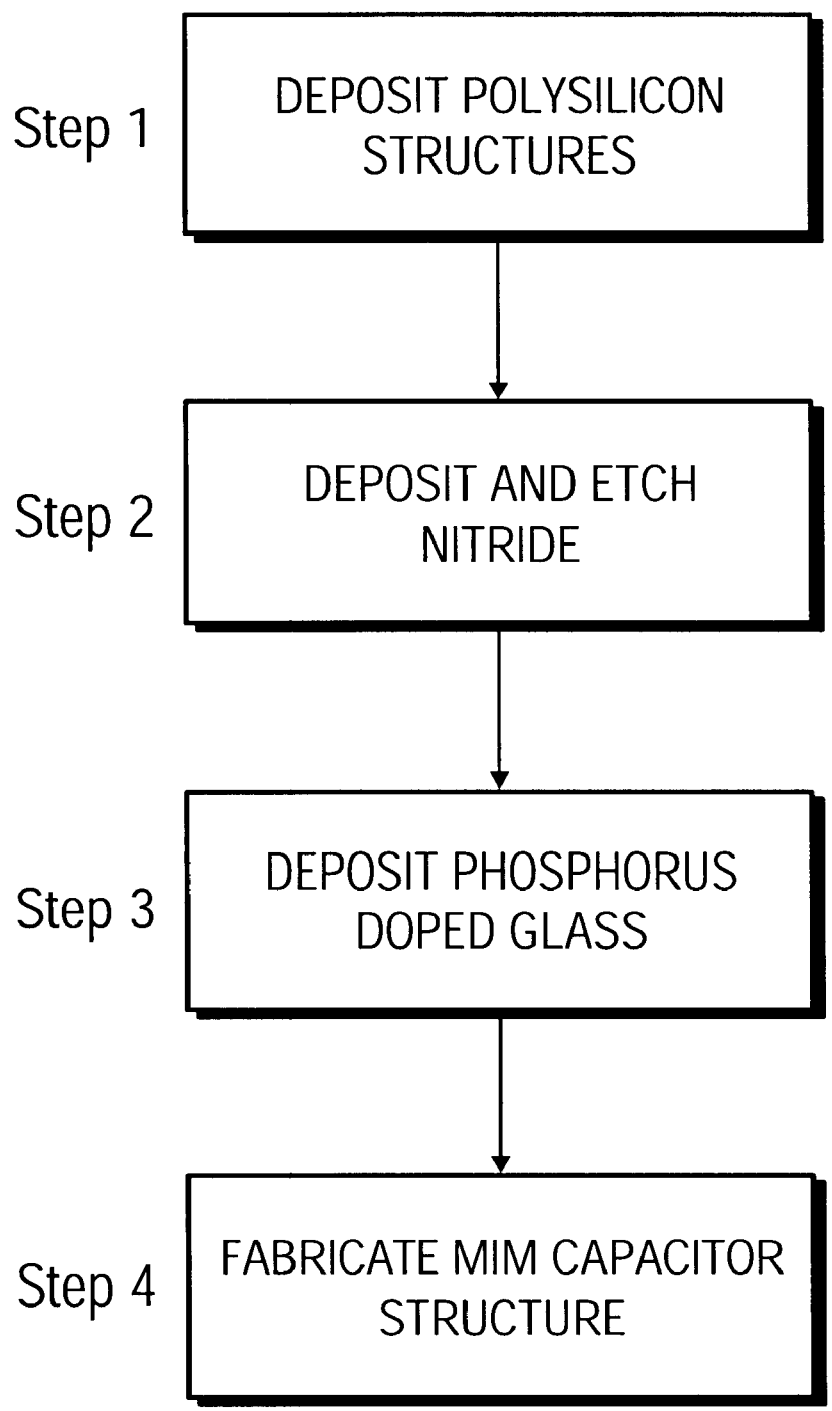
FIG. 5 shows a flow chart with key steps to the preferred embodiment.

FIG. 5 shows a flow chart with key steps to the preferred process flow. Polysilicon lines are deposited during a poly gate structure deposition process step (step 1). The lines are placed at minimum thickness and spacing, in a pattern that optimizes the area covered by the nitride sidewalls. Next, nitride is deposited in a blanket deposition, followed by a blanket etchback (step 2). This leaves the nitride sidewalls and nitride caps formed on the polysilicon structures. This layer is then covered by a phosphorous doped glass (step 3). Next, the dielectrics and metal lines of the MIM capacitor structure are fabricated, using all necessary process steps (step 4). Several metal and dielectric levels are formed, depending on the needs of the process.

In the preferred embodiment, the polysilicon lines are deposited on a field oxide. Placing the active p well regions next to the poly lines that will serve as "ground" for the capacitor structure allows a solidly grounded side of the capacitor without having to route metal to it.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

While the inventions have been described with primary reference to a single-poly process, it will be readily recognized that these inventions can also be applied to process with two, three, or more layers of polysilicon or polycide.

It should also be noted that the number of layers of metallization described above does not implicitly limit any of the claims, which can be applied to processes and structures with more or fewer layers.

Similarly, while the contact from first metal to poly and active has been particularly described, it will be readily recognized that the disclosed inventions are equally applicable to processes with multiple layers of metal (and in fact would be most commonly used in such processes).

Similarly, it will be readily recognized that the described process steps can also be embedded into hybrid process flows, such as BiCMOS or smart-power processes.

The teachings above are not necessarily strictly limited to silicon. In alternative embodiments, it is contemplated that these teachings can also be applied to structures and methods using other semiconductors, such as silicon/germanium and related alloys, gallium arsenide and related compounds and alloys, indium phosphide and related compounds, and other semiconductors, including layered heterogeneous structures.

It should also be noted that, over time, an increasing number of functions tend to be combined into a single chip. The disclosed inventions can still be advantageous even with different allocations of functions among chips, as long as the functional principles of operation described above are still observed.

Additional general background, which help to show the knowledge of those skilled in the art regarding variations and implementations of the disclosed inventions, may be found in the following documents, all of which are hereby incorporated by reference: Coburn, PLASMA ETCHING AND REACTIVE ION ETCHING (1982); HANDBOOK OF PLASMA PROCESSING TECHNOLOGY (ed. Rossnagel); PLASMA ETCHING (ed. Manos and Flamm 1989); PLASMA PROCESSING (ed. Dieleman et al. 1982); Schmitz, CVD OF TUNGSTEN AND TUNGSTEN SILICIDES FOR VLSI/ULSI APPLICATIONS (1992); METALLIZATION AND METAL-SEMICONDUCTOR INTERFACES (ed. Batra 1989); VLSI METALLIZATION: PHYSICS AND TECHNOLOGIES (ed. Shenai 1991); Murarka, METALLIZATION THEORY AND PRACTICE FOR VLSI AND ULSI (1993); HANDBOOK OF MULTILEVEL METALLIZATION FOR INTEGRATED CIRCUITS (ed. Wilson et al. 1993); Rao, MULTILEVEL INTERCONNECT TECHNOLOGY (1993); CHEMICAL VAPOR DEPOSITION (ed. M. L. Hitchman 1993); and the semiannual conference proceedings of the Electrochemical Society on plasma processing.

What is claimed is:

1. An integrated circuit capacitor structure, comprising:
    at least first level comprising interdigitated thin film lines having a first dielectric material on sidewalls thereof;
    multiple second levels, each parallel with and vertically spaced from said first level, and each comprising interdigitated metal structures with a second dielectric material formed between said metal structures;

wherein said first dielectric material has more than 1½ the permittivity of said second dielectric material;

and wherein pairs of said interdigitated lines, in respective ones of said levels, are interconnected to form a single capacitor.

2. The integrated circuit capacitor structure of claim 1, wherein said thin film lines are aligned on-center with said interdigitated metal structures.

3. The integrated circuit capacitor structure of claim 1, wherein said thin film lines are only minimally spaced apart.

4. The integrated circuit capacitor structure of claim 1, wherein said thin film lines comprise cladded polysilicon lines.

5. The integrated circuit capacitor structure of claim 1, wherein said first dielectric material is silicon nitride.

6. The integrated circuit capacitor structure of claim 1, wherein said second dielectric material is a low-k dielectric.

7. The integrated circuit capacitor structure of claim 1, wherein said thin film lines are laid out in a pattern which maximizes intralevel capacitive coupling through said first dielectric material.

8. The integrated circuit capacitor structure of claim 1, wherein said thin film lines fare laid out in a "Christmas tree" pattern.

9. An integrated circuit metal-insulator-metal capacitor structure, comprising:

at least first level comprising interdigitated thin film lines having a first dielectric material on sidewalls thereof, and a second dielectric material between said lines where said first dielectric material is not present;

multiple second levels, each parallel with and vertically spaced from said first level, and each comprising interdigitated metal structures;

wherein said first dielectric material has more than 1½ times the permittivity of said second dielectric material;

and wherein pairs of said interdigitated lines, in respective ones of said levels, are interconnected to form a single capacitor.

10. The integrated circuit capacitor structure of claim 9, wherein said thin film lines are only minimally spaced apart.

11. The integrated circuit capacitor structure of claim 9, wherein said thin film lines are aligned on-center with said interdigitated metal structures.

12. The integrated circuit capacitor structure of claim 9, wherein said thin film lines comprise cladded polysilicon lines.

13. The integrated circuit capacitor structure of claim 9, wherein said first dielectric material is silicon nitride.

14. The integrated circuit capacitor structure of claim 9, wherein said second dielectric material predominantly comprises oxide.

15. The integrated circuit capacitor structure of claim 9, wherein said thin film lines are laid out in a pattern which maximizes intralevel capacitive coupling through said first dielectric material.

16. The integrated circuit capacitor structure of claim 9, wherein said thin film lines are laid out in a "Christmas tree" pattern.

* * * * *